United States Patent [19]
Duong

[11] Patent Number: 5,880,598
[45] Date of Patent: Mar. 9, 1999

[54] TILE-BASED MODULAR ROUTING RESOURCES FOR HIGH DENSITY PROGRAMMABLE LOGIC DEVICE

[75] Inventor: Khue Duong, San Jose, Calif.

[73] Assignee: Xilinx, Inc., San Jose, Calif.

[21] Appl. No.: 781,251

[22] Filed: Jan. 10, 1997

[51] Int. Cl.[6] .......................... H03K 7/38; H03K 19/177
[52] U.S. Cl. ............................................... 326/41; 326/39
[58] Field of Search ....................................... 326/39, 41

[56] References Cited

U.S. PATENT DOCUMENTS

| | | | |
|---|---|---|---|
| 5,359,536 | 10/1994 | Agrawal et al. | 326/41 |
| 5,682,107 | 10/1997 | Tavana et al. | 326/41 |
| 5,701,091 | 12/1997 | Kean | 326/41 |
| 5,757,207 | 5/1998 | Lytle et al. | 326/41 |

*Primary Examiner*—Michael J. Tokar
*Assistant Examiner*—Richard Roseen
*Attorney, Agent, or Firm*—Anthony C. Murabito; Wagner Murabito & Hao; Jeanette S. Harms

[57] ABSTRACT

Signal routing resource tiles that can be manipulated as circuit "cells" in that they can be readily characterized and implemented on a programmable logic device, e.g., a field programmable gate array (FPGA). In one embodiment, vertical placement and horizontal placement routing resource tiles are provided. Routing resources tiles may be selectively added in areas of the programmable logic device determined to be prone to high signal congestion, e.g., the central portions of the array, and along the array perimeter. The additional routing resource tiles simplify routing for complex logic functions and increase utilization of configurable logic blocks (CLBs) forming the array. The tiles can be positioned within the array in any position horizontally or vertically within the CLB array. Specifically, placement can be either in the core of the chip or along the periphery with each tile providing programmable connections to the existing routing resources (e.g., input/output ports) within the CLBs. A corner tile is also provided that permits interconnection between horizontal and vertical tiles. The tiles are modular in nature so the number of tiles provided within an array and their placement are determined based on the array's particular need for routing resources, e.g., an array can have one, two or more tiles associated with a row or column of CLBs in areas of the chip where congestion is typically encountered. Each tile of the present invention can also include a plurality of switch matrices, buffers, or other active gates to facilitate signal routing.

23 Claims, 9 Drawing Sheets

TILE-BASED MODULAR ROUTING RESOURCES FOR HIGH DENSITY PROGRAMMABLE LOGIC DEVICE

FIELD OF THE INVENTION

The present invention relates to semiconductor logic devices. More particularly, the present invention relates to a method and apparatus for providing increased routing capacity in programmable logic devices, e.g., field programmable gate array devices.

BACKGROUND OF THE INVENTION

Programmable integrated circuits such as field programmable gate arrays (FPGAs) and complex programmable logic devices (CPLDs) are examples of integrated circuit devices that have an array of programmable logic blocks surrounded by peripheral input/output blocks. Also located within the array are signal routing resources that are programmable. Programmable logic blocks are often referred to as configurable logic blocks (CLBs). CLBs may be configured to implement specific logic functions selected from a macro cell library. Many manufacturers of ASICs, FPGAs or CPLDs have developed extensive libraries of logic functions that may be implemented in the CLBs. As is well understood in the art, FPGAs and CPLDs may be configured to rapidly perform desired logic functions to shorten the design and fabrication time schedule of a custom integrated circuit device.

Typically, each CLB has a plurality of input ports (for example, 15 inputs) which may include signals, clock and control inputs, and a plurality of output ports (for example, 5 outputs). Using the programmable routing resources discussed above, each CLB input and output port (e.g., "input" and "output") can be programmably connected by interconnect segments to other selected CLB outputs and its input or to the input/output blocks. In this manner, circuit designers can implement complex logic functions on the integrated circuit device. These interconnect segments are laid out in areas of the device between the CLBs and between the CLBs and the input/output blocks reserved for such interconnections. The segments are typically routed in either a horizontal or vertical direction with, by way of example, the horizontal metal segments routed in a layer of metal either above or below the vertical metal segments.

As manufacturing techniques improve, the size of the CLBs decreases and thereby the number of CLBs that can be placed within a programmable logic device increases. As the number of CLBs that can be provided within an array increases, the complexity of logic functions that can programmed onto the integrated circuit device also increases. However, as the number of CLBs increases, signal routing between CLBs and input/output blocks becomes a major problem for circuit designers. As is well known in the art, routing the interconnections between large numbers of CLBs is a very difficult task that: (1) requires sophisticated placement and routing application software; and (2) demands large amounts of routing resources, (e.g., routing time is a function of the routing resources).

In prior art programmable logic devices, the locations of the signal routing resources are predefined. In effect, unlike the CLBS, the signal routing resources of the prior art are not modular, e.g., they are not provided in discrete "cells" that can be placed within the array. Therefore, a signal routing resource allocation or design that is operable for an N×N array can supply extremely insufficient amount of interconnects for a larger array (e.g., 2N×2N).

Therefore, a significant limitation on the complexity of logic functions that can be implemented on the integrated circuit device is attributed to a lack of sufficient routing resources for interconnecting CLBs within a programmable logic array. In view of this limitation, it is a common practice to fully utilize all routing resources within a programmable logic array long before all of the available CLBs can be utilized. As will be appreciated by one skilled in the art, routing congestion usually occurs worst in the middle of the circuit or in other known areas of the circuit. CLB "under-utilization" is expensive because the price of integrated circuit devices is highly dependent on the physical dimension of the device and full CLB utilization is desired.

One method to increase CLB utilization is to manually lay-out a portion of the routing resources ("interconnects"). For instance, this method would provide for manually redesigning the predefined routing resource design for a programmable logic device based on its array size. However, manual lay-out is a time consuming and expensive task that is prone to mistakes. Further, it is difficult and time consuming to run design verification and simulation software on circuits having at least a portion of the interconnections manually redone thereby increasing the possibility that design errors will not be detected until after release of the circuit. Lastly, since the number of array sizes is only limited by semiconductor fabrication equipment, this method can require a new interconnect design for each array size.

One method to increase signal routing resources within a programmable array is to increase the resource allotment within the macro cell defining the CLB. However, doing so can require modification of the macro cell library of logic functions when the macro cells include the interconnect segments. Modification of the macro cell library is a time consuming effort and, once modified, each macro cell must be resimulated and proper operation verified, which is an expensive and time consuming task. Also, modifying each macro cell can be unnecessary because routing congestion usually occurs in particular selected targeted areas, as indicated above. If the above is done, then the die size increases as well as the cost thereof and, in addition, many routing resources may be left unused.

Accordingly, it would be desirable to provide a signal routing design that provides a more modular mechanism for providing signal routing resources to a programmable logic array. Further, it would be desirable to provide, in a system as above, additional routing channels in selected areas of the programmable arrays where signal congestion typically is encountered. Finally, it would be desirable to provide the above within a circuit design that does not require modification of the CLB macro cell design so that existing libraries can be used to provide new, high density, device families that have significant numbers of CLBs on the device.

SUMMARY OF THE INVENTION

The present invention relates to signal routing resource tiles that can be manipulated as circuit "cells" in that they can be readily characterized and implemented on a programmable logic device, such as application specific integrated circuits (ASICs) or field programmable gate arrays (FPGAs). Specifically, the present invention provides signal routing resource tiles that, when coupled with existing routing resources of programmable gate arrays, allows increased CLB utilization by alleviating signal routing limitations, especially in large sized arrays. Therefore, the routing tiles of the present invention are in addition to the existing routing resources provided by the existing macro cell library.

The routing resource tiles of the present invention are modular. In effect, they are resource "cells" that can be freely placed by the FPGA designer within the FPGA array. The tiles are easily replicated so that gate array devices can have one, two or more tiles associated with selected rows or columns of the semiconductor device to significantly increase routing resources in areas of the array where logic designers expect routing congestion to occur upon programming. Since the tiles of the present invention are modular, it is possible to replicate the tiles across the array of the integrated circuit. Use of modular tiles can thus increase routing resources including high speed transmission lines even as process improvements permit an increase in CLB density or as new families of devices are introduced. By providing a separate routing resource tile, rather than modifying the CLB structure, the present invention allows CLB array size to be significantly increased for new FPGA families (developed in a relatively short period of time) while advantageously using existing logic function libraries.

Since routing resource tiles are modular, it is possible to minimize the size of the integrated circuit device and at the same time utilize a higher percentage of the available CLBS. With only minor modification to existing placement and routing application software it is possible to utilize the additional routing resources to optimize placement of the logic functions and maximize CLB utilization.

Specifically, the added tiles can be positioned either horizontally or vertically either in the core of the chip or along the periphery with programmable connections to the input or output ports of existing CLBS. A corner tile is also provided that permits interconnection between horizontal and vertical tiles or between adjacent horizontal tiles or adjacent vertical tiles to form a contiguous routing channel. It is a particular advantage of the present invention that routing resources can be selectively added in high density and congested areas of the device, such as in the array middle, to increase routing capacity and speed up routing time for complex logic functions in a cost effective manner.

In one embodiment, the tiles provide a plurality of lines (e.g., signal and clock lines), including, for example, long lines, quad lines, octal lines, local lines and clock lines that can be added into the programmable logic device. Long lines may be used to route clock and other signals having high fan-out requirements. Quad and octal lines can be used to route signals from one CLB to another CLB that is up to four or eight CLBs away from the originating CLB, respectively. Local lines may be used to route signals between adjacent CLBs. Further, one embodiment of the present invention includes a plurality of switch matrices, buffers, or other active gates in addition to signal line interconnections to facilitate signal communication.

It is possible to create a family of arrays with selected amounts of routing resources. As new arrays are developed, existing macro cell libraries may be utilized with the necessary routing resources provided by the addition of the plurality of tiles to overcome the restricted routing capability often encountered in large arrays while minimizing the size of the integrated circuit device. Further, the electrical parameters of the tiles can be characterized on test chips and the data incorporated into the design library so that new arrays having a variety of routing capacity can be quickly and economically brought to market.

DETAILED DESCRIPTION OF THE INVENTION

Figure 1A:
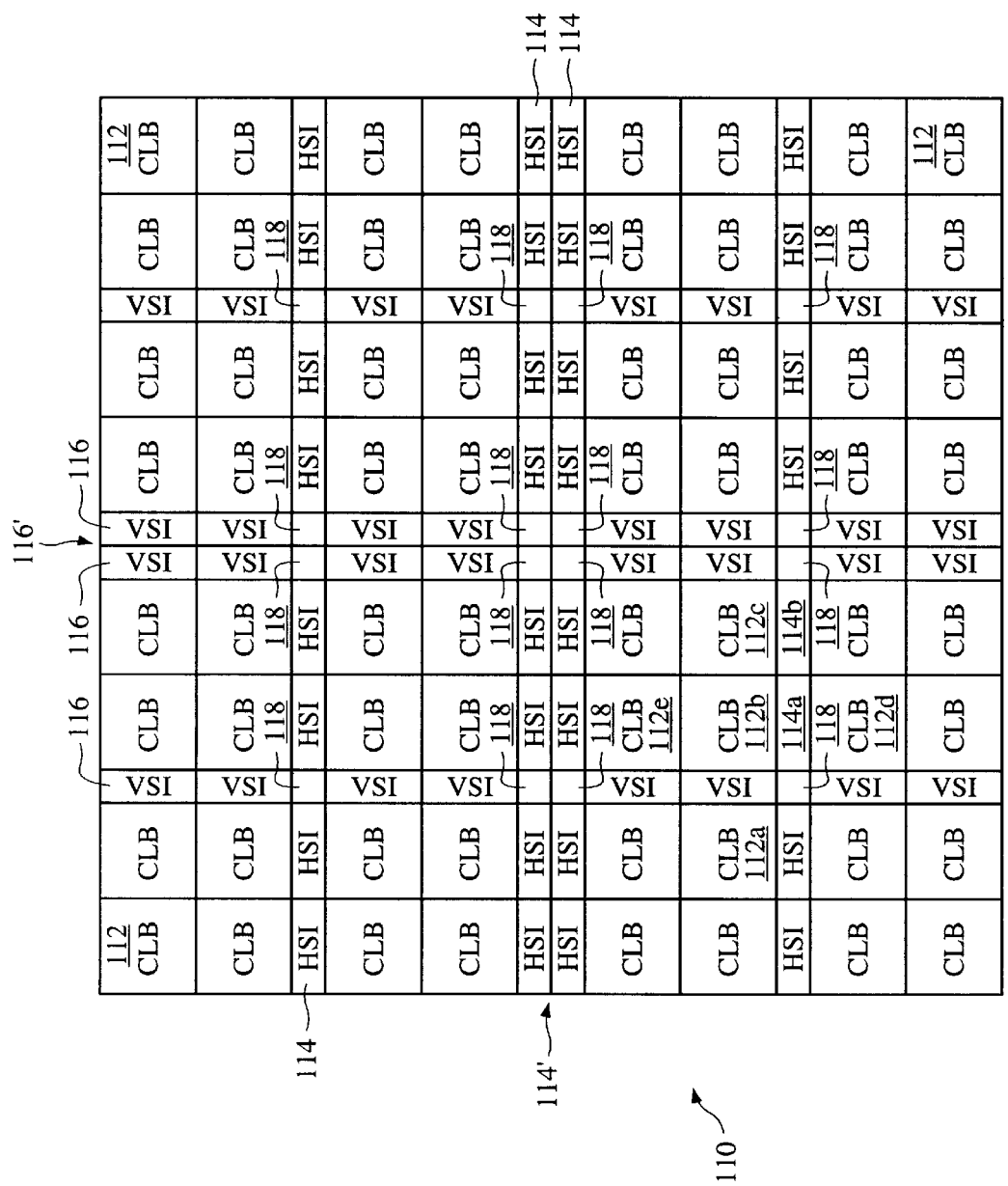
FIG. 1A illustrates one embodiment of a semiconductor device having logic elements arranged in matrix form together with vertical and horizontal tiles of the present invention.

FIG. 1A illustrates a representative field programmable gate array (FPGA) 110 having an (n×m) array of configurable logic blocks (CLBs) 112 where n may equal m. The logic functions performed by FPGA 110 can be implemented by appropriately configuring and interconnecting the CLBs using a number of well known techniques. In this embodiment, FPGA 110 is shown having an 8×8 array of configurable logic blocks (CLBs) 112 although it will be appreciated that arrays of various sizes are contemplated herein. Although the routing resource tiles of the present invention are well suited to application with different types of CLBs, one particular implementation is described with respect to FIG. 8 below.

With reference to FIG. 1A, FPGA 110 further includes a number of horizontal routing resource tiles 114 and a number of vertical routing resource tiles 116 for distributing signals horizontally and vertically, respectively, across the array. The horizontal and vertical routing resource tiles 114 and 116 are also referred to, respectively, as horizontal standard interconnects (HSI) 114 and vertical standard interconnects (VSI) 116. It is appreciated that the routing resources added by the tiles of the present invention are in addition to any routing resources provided within a CLB of a conventional FPGA. A plurality of horizontal, vertical and corner tiles 114, 116 and 118, respectively, are located between selected rows and columns of CLBs 112 respectively. Corner tiles 118 allow connection between individual adjacent HSIs 114 and VSIs 116. Tiles 114, 116 and 118 of the present invention are used to increase routing resources in FPGA 110 so that a high percentage of available CLBs 112 can be configured for high density logic circuit designs.

In accordance with the present invention, to relieve routing congestion, HSIs 114, VSIs 116 and corner tiles 118 are added to portions of the array in which the FPGA designer expects routing congestion to occur. In effect, the routing tiles of the present invention can be placed in any position, in any configuration within the FPGA array to relieve signal congestion, and do not necessarily need to span the entire length of the programmable device. If the routing tiles do not span the entire length (or width), the space normally occupied by the tiles would be replaced with additional logic or with tiles having limited conductive segments to facilitate interconnection between adjacent CLBs. In FIG. 1A, the central portion of the array includes two adjacent VSI lines (double width line 116') and also two adjacent HSI lines (double width line 114') wherein a line is a continuous section of coupled tiles of a similar type with corner tile junctions, where needed. In this embodiment, single width VSI lines 116 and single width HSI lines 114 are provided in a uniform distribution grid across the array. It is appreciated that the routing resource lines (horizontal and vertical) can be made of any desired width, e.g., single, double, triple, etc., depending on the amount of expected signal congestion in their locations.

An advantage of the present invention is that additional routing resources (tiles) can be added to a particular FPGA design to create a "custom" routing structure using modular circuit elements that are pre-designed and can readily be replicated, thereby reducing the design time required to add the routing structure. In effect, routing resources of the present invention can be selectively added throughout the FPGA (to create a semi-custom layout) without requiring custom circuitry and the lengthy design and development time required of custom circuitry.

Figure 1B:
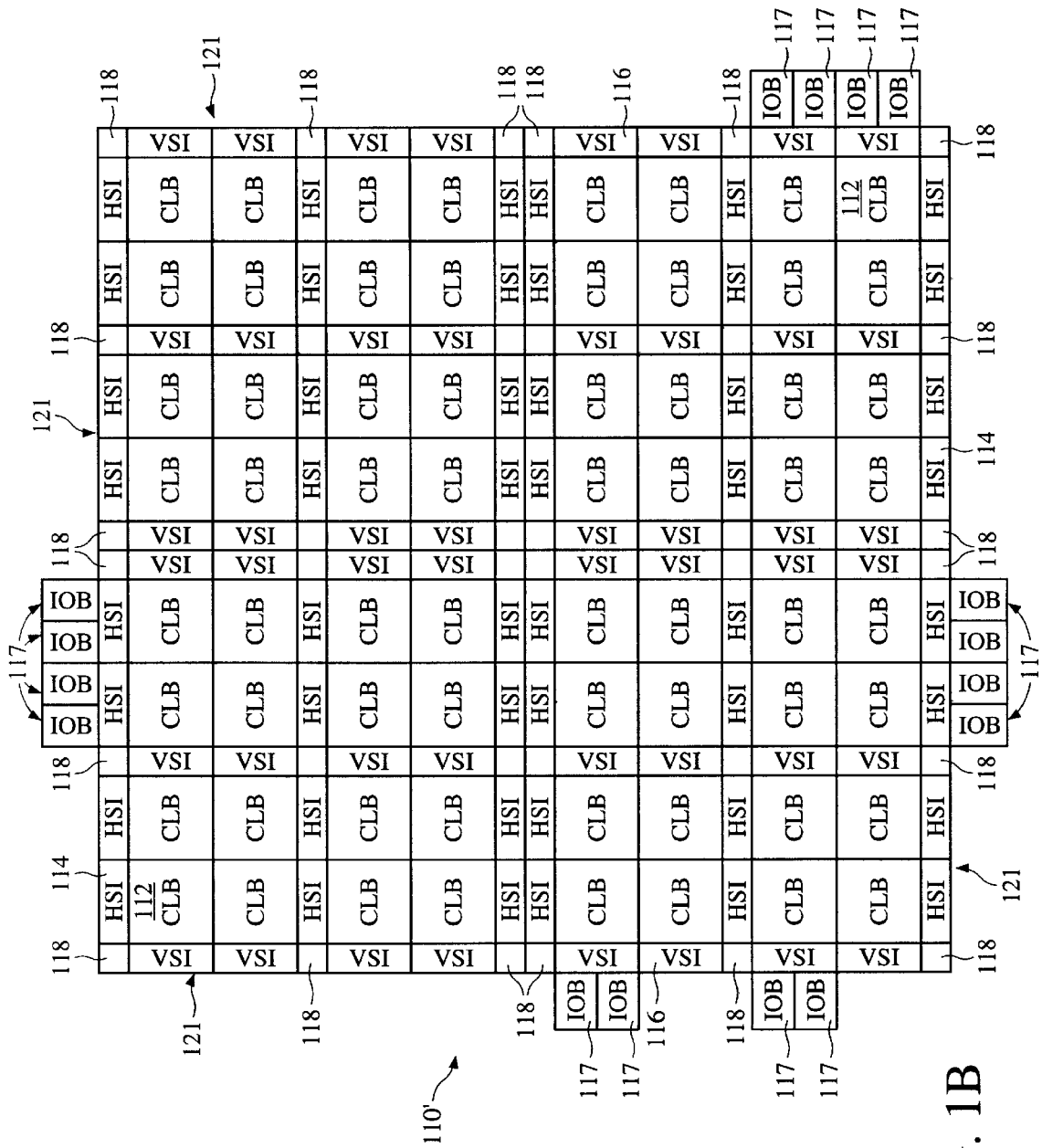
FIG. 1B illustrates a second embodiment of a semiconductor device having logic elements arranged in matrix form together with vertical and horizontal tiles of the present invention including various input/output blocks (IOBs).

FIG. 1B illustrates an FPGA device 110' similar to FPGA device 110 of FIG. 1A with the addition of routing resource tiles disposed around the perimeter of the array of CLBs 112 in a routing resource ring 121. Wherever possible in the discussion to follow, the same reference numbers will be used throughout in the drawings to refer to the same or like components. Ring 121 is composed of lines of VSI tiles 116 and lines of HSI tiles 114 coupled at their corners with corner tiles 118. Since input/output blocks typically are disposed along the perimeter of the CLB array, routing resource ring 121 facilitates signal communication into and out of the CLB array via the input/output blocks. Although shown as a single width ring, routing resource ring 121 of FIG. 1B could also be double width, triple width, etc. In accordance with the present invention, many different FPGA configurations can be realized using different routing resource layouts.

FIG. 1B illustrates a plurality of input/output blocks (IOBs) 117 disposed along the periphery of device 110'. IOBs 117 provide an input/output interface between CLBs 112 and other circuitry either internal or external to device 110'. It is appreciated that VSI tiles 116 and HSI tiles 114 can be connected in sequence (e.g. in lines) and used to provide communication channels between IOBs 117 of device 110'.

Figure 2:
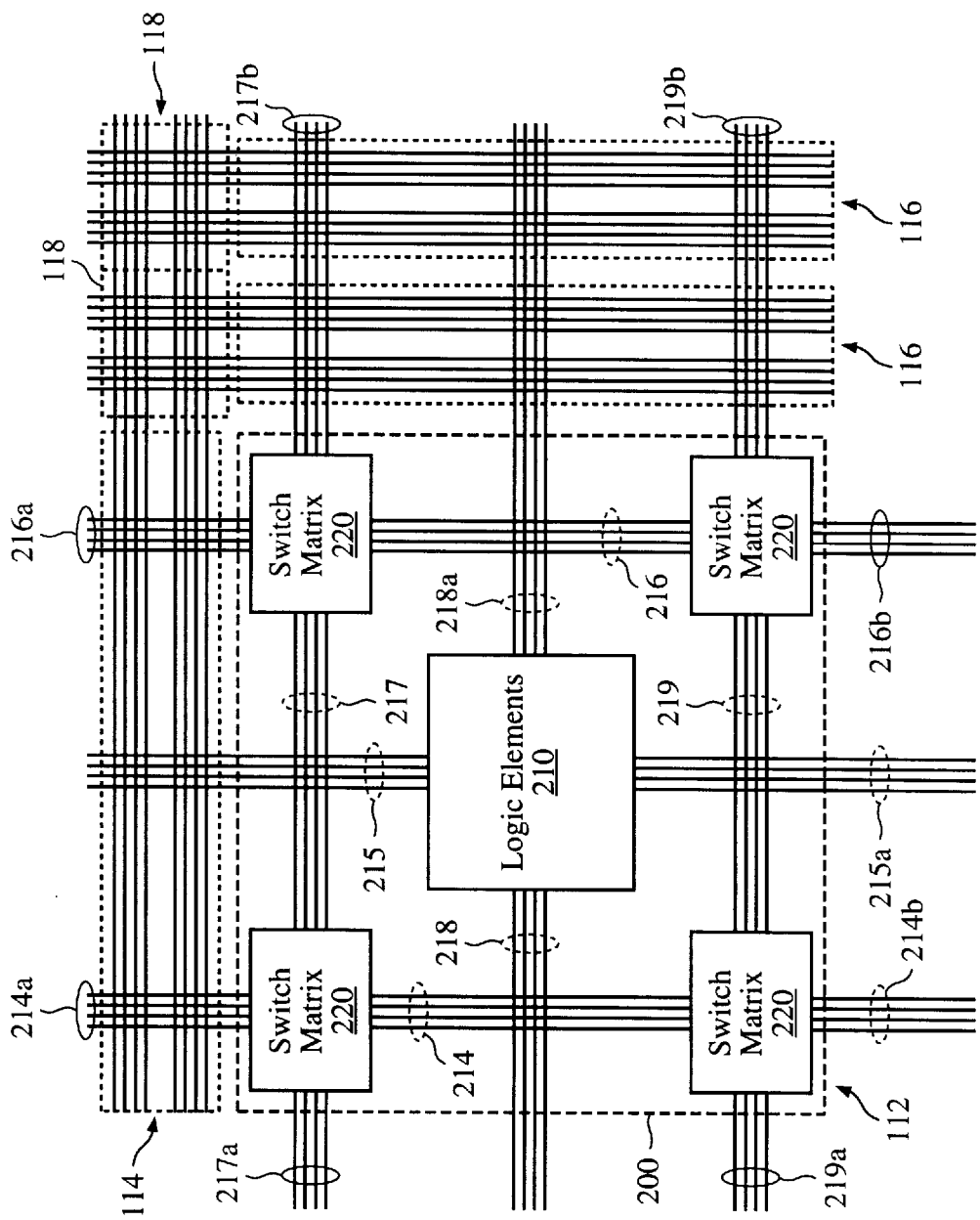
FIG. 2 illustrates a representative interconnect structure of a configurable logic block (CLB) interfacing with interconnecting tiles (e.g., vertical (VSI), horizontal (HSI) and corner routing resource tiles) of the present invention.

As shown in FIG. 2, the dashed line 200 defines a boundary of each CLB 112. CLB 112 includes logic elements 210 such as buffers, latches, function generators, flip/flops, memory cells, other high level circuits, or other discrete components (described with reference to FIG. 8), as well as routing resources such as vertical conductor segments 214, 214a, 214b, 215, 215a, 216, 216a, and 216b and horizontal conductor segments 217, 217a, 217b, 218, 218a, 219, 219a, and 219b. The conductor segments can be programmably connected or coupled to logic elements 210 to form input or output ports of CLB 112. These output ports can be programmably interconnected to various logic elements of other CLBs such as CLB 112b of FPGA 110 (FIG. 1A). In one embodiment, switch matrices 220 are disposed in the four corners of CLB 112 and can be used to selectively interconnect vertical conductor segments (214a, 214, 214b, 216a, 216, and 216b) to horizontal conductor segments (217a, 217, 217b, 219a, 219, and 219b)

Figure 4B:
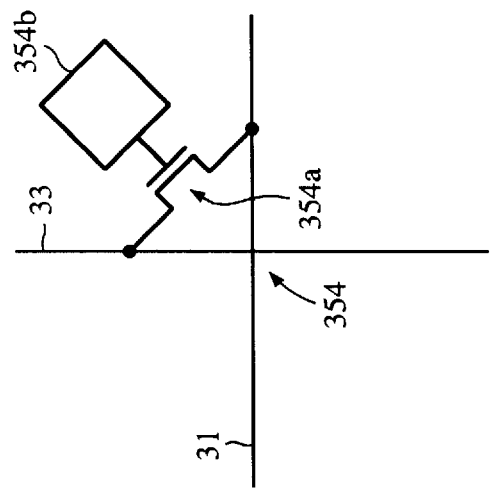
FIG. 4A and FIG. 4B illustrate a circuit schematic of a programmable interconnect point (PIP) used in accordance with the present invention.
Figure 4A:
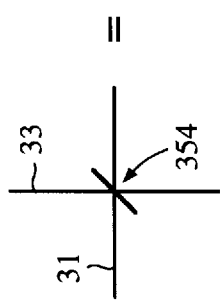

Each switch matrix 220 contains a number of programmable interconnection points (PIPs) and/or buffers (FIG. 5) located at the intersection of the conductor segments. FIG. 4A shows a typical representation of a PIP. As shown in FIG. 4B, each PIP 354 comprises a pass transistor 354a that can be configured by programming a memory unit 354b whose programmed state determines whether or not the two intersecting signal lines (lines 31 and 33) are to be electrically coupled. Switch matrices of the kind described above are well known in the art, and are described, for example, in "The Programmable Logic Data Book" by Xilinx, Inc. of San Jose, Calif., (1994) on pages 2–14 to 2–16.

In one embodiment, the area of an exemplary CLB 112 is approximately $625$–$650\mu^2$. However, the area of the CLB should be considered for reference purposes only since improvements in design rules will permit reduction in device geometry and thus provide denser circuit structures.

In FIG. 2, CLB 112 is shown having an HSI 114 disposed adjacent to the top boundary of CLB 112 and two VSI tiles 116 disposed adjacent to the right vertical boundary of CLB 200. By interconnecting segments 214a, 215 and 216a to the vertical conductor segments of HSI tile 114, the present invention significantly increases resources for routing signals because HSI tiles 114 of the present invention are in addition to segments 217, 217a, 217b and 219, 219a and 219b of CLB 112. Similarly, by interconnecting segments 217b, 218a and 219b to the routing resources of VSI tiles 116, the present invention provides even more valuable routing resources. Corner tiles 118 are used to couple routing resources of HSI tiles 114 with VSI tiles 116 or to another HSI tile 114 (not shown) juxtaposed to the right of corner tiles 118. Analogously, corner tiles 118 are used to couple routing resources of VSI tiles 116 with HSI tiles 114 or to another VSI tile 116 (not shown).

Figure 3:
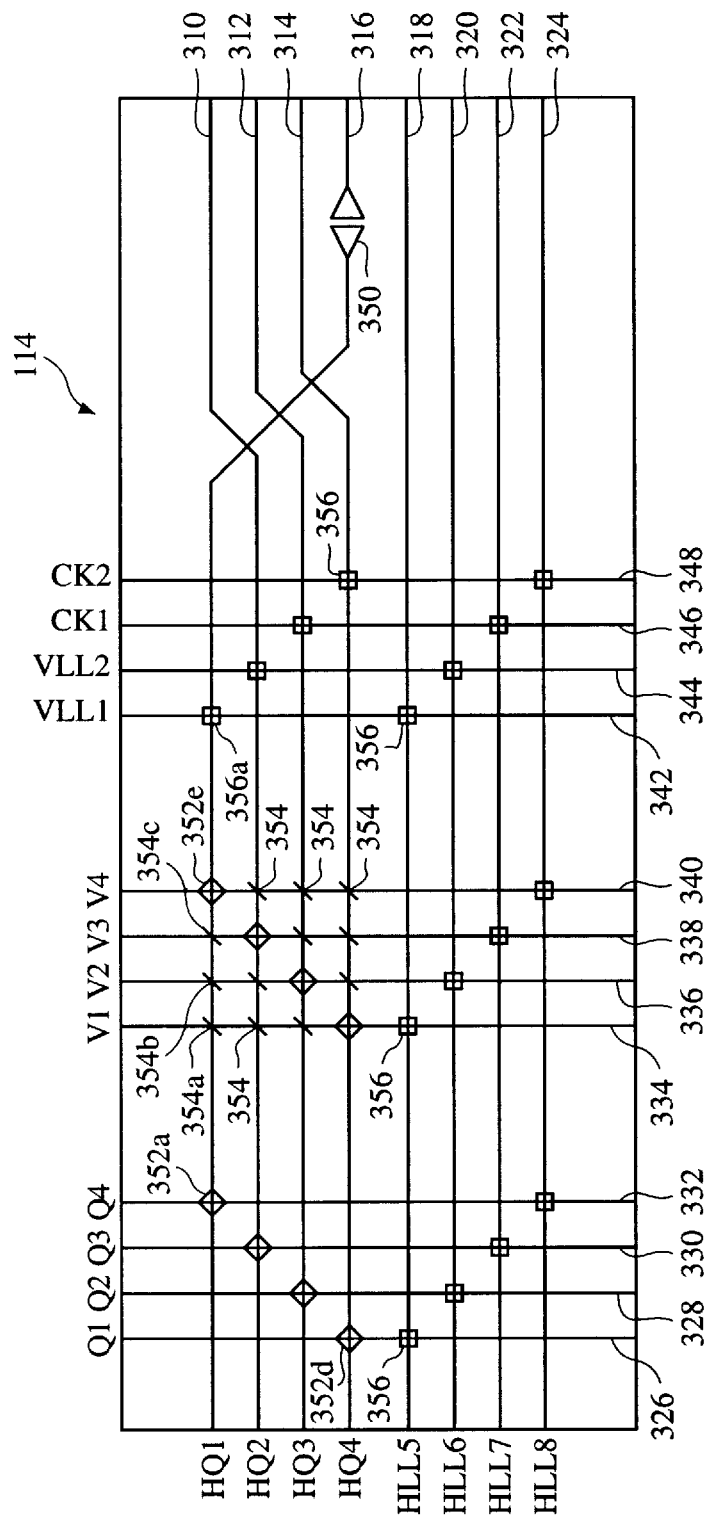
FIG. 3 is a detailed view of a horizontal signal routing resource tile (HSI) in accordance with the present invention.

FIG. 3 shows an exemplary embodiment of an HSI tile 114 in greater detail. Specifically, HSI tile 114 includes a plurality of horizontal conductive segments 310, 312, 314, 316, 318, 320, 322, and 324 (e.g., 310–324). Segments 310–324 can be interconnected with adjacent HSI tiles 114 (not shown), or corner tiles 118 (also not shown), to form local, octal, and quad signal lines. For example, in one embodiment, segments 310, 312, 314, and 316 are interconnect quad lines ("segments"), and segments 318, 320, 322, and 324 are interconnected with adjacent HSI tiles 114 or corner tiles 118 (neither shown) to form long lines which are useful for routing clock or other control signals. Note that lines 326, 328, 330, 332, 334, 336, 338, 340,342, 344, 346, and 348 (e.g. 326–348) although present within HSI tile 114 represent existing interconnect structure of a CLB 112 and thus are not "added" routing resources of HSI tile 114. However, interconnection circuitry is added by the present invention which interfaces with these existing interconnect structures. In one embodiment, segments 326, 328, 330, and 332 are quad lines, segments 334, 336, 338, and 340 are local lines, and segments 342, 344, 346, and 348 are long lines. The layout positioning of these segments 326–348 permit interface with the input and output ports of the adjoining CLBs or adjoining tiles above or below tile 114. By way of example, lines 326, 328, 330, and 332 interface with lines 214a (see FIG. 2), lines 334, 336, 338, and 340 interface with lines 215, while lines 342, 344, 346, and 348 interface with lines 216a.

Within HSI tile 114, a programmable bi-directional buffer 350 is provided on horizontal conductive segment 316 of interconnect quad lines 310, 312, 314, and 316. With this buffer 350, and the interconnection "jog," a signal on any segment of quad lines 310, 312, 314, and 316 can be buffered in either direction, once every four adjacently coupled HSI tiles 114. This feature is useful if a signal output of a CLB has a high fan-out. Alternatively, bi-directional buffer 350 can also be configured to isolate conductive segment 316 from interconnecting segments of adjoining tiles. Bi-directional buffers 350 are well known in the art and any number of buffer designs can be used as buffer 350 in accordance with the present invention.

Within exemplary tile 114, long line segments 318, 320, 322, and 324, and segments 326, 328, 330, 332, 334, 336, 338, 340, 342, 344, 346, and 348 can be selectively interconnected using disposed programmable interconnects 356 to form logic networks. In an alternative embodiment, the interconnects can also be metal vias programmed during the manufacturing process. In one embodiment of the present invention, programmable interconnects 356 are buffers that, when programmed, act to buffer a signal onto a long line and connect but normally do not buffer the signals off of a long line.

Within exemplary tile 114, quad segments 310, 312, 314, and 316 and segments 326, 328, 330, 332, 334, 336, 338, 340, 342, 344, 346, and 348 can be selectively interconnected using a combination of: (1) disposed programmable interconnect points (PIPs), e.g., 354, 354a, 354b, and 354c; (2) disposed programmable six-transistor matrices, e.g., 352a–352e; and (3) disposed buffers, e.g., 356a and 356. Each of the programmable six-transistor matrices 352a–352e comprises a collection of six programmable transistors allowing the transfer of signals from one line to any other line. For example, segment 326 can be coupled to segment 314 by programming six-transistor matrix 352d. A representative design of a buffered six-transistor matrix 352 is disclosed in pending commonly assigned U.S. patent application, Ser. No. 08/548,926 filed Oct. 16, 1995, the disclosure of which is hereby incorporated herein by reference. Other six-transistor matrices are described in detail in U.S. Pat. No. 4,713,557 (incorporated herein by reference) entitled "Bidirectional Buffer Amplifier" issued Dec. 15, 1987 to Carter. Note that bi-directional buffer 350 of the present invention is also described in U.S. Pat. No. 4,713, 557.

Referring to FIGS. 1A and 3, a signal from CLB 112b can be transmitted to CLB 112c using HSI tile 114a and adjacently located HSI tile 114b by appropriately configuring one of six-transistor matrix 352a–d (of HSI tile 114a). Specifically, signals are passed from, by way of example, a segment of segments 326, 328, 330, and 332 to a metal segment of segments 310, 312, 314, and 316 of horizontal tile 114a to one or more of the following segments: segment 326, 328, 330, and 332 (of an adjacently located HSI tile 114b) if a six-transistor matrix 352a–352d, respectively, is programmed; segments 334, 336, and 338 (of an adjacently located HSI tile 114b) if PIPs 354a–354c are programmed; or segment 342, 344, 346, and 348 (of an adjacently located HSI tile 114b) if a buffer of buffers 356 is properly configured.

Quad lines 310, 312, 314, and 316 can be selectively connected to segments 334, 336, 338, and 340 by programming PIPs 354 in a manner described with reference to FIG. 4B. Further, signals on segments 326, 328, 330, 332, 334, 336, 338, 340, 342, 344, 346, and 348 can be programmably buffered onto long lines 318, 320, 322, and 324 and routed to remotely located CLBs in a manner that is well understood in the art. Due to loading constraints, it is desirable to buffer clock and non-clock control signals before providing such signals onto segments 310, 312, 314, and 316 or long line segments 318, 320, 322, and 324. Accordingly, buffers 356 may selectively couple segments 342, 344, 346, and 348 to segments 310, 312, 314, 316, 318, 320, 322, and 324.

Figure 5:
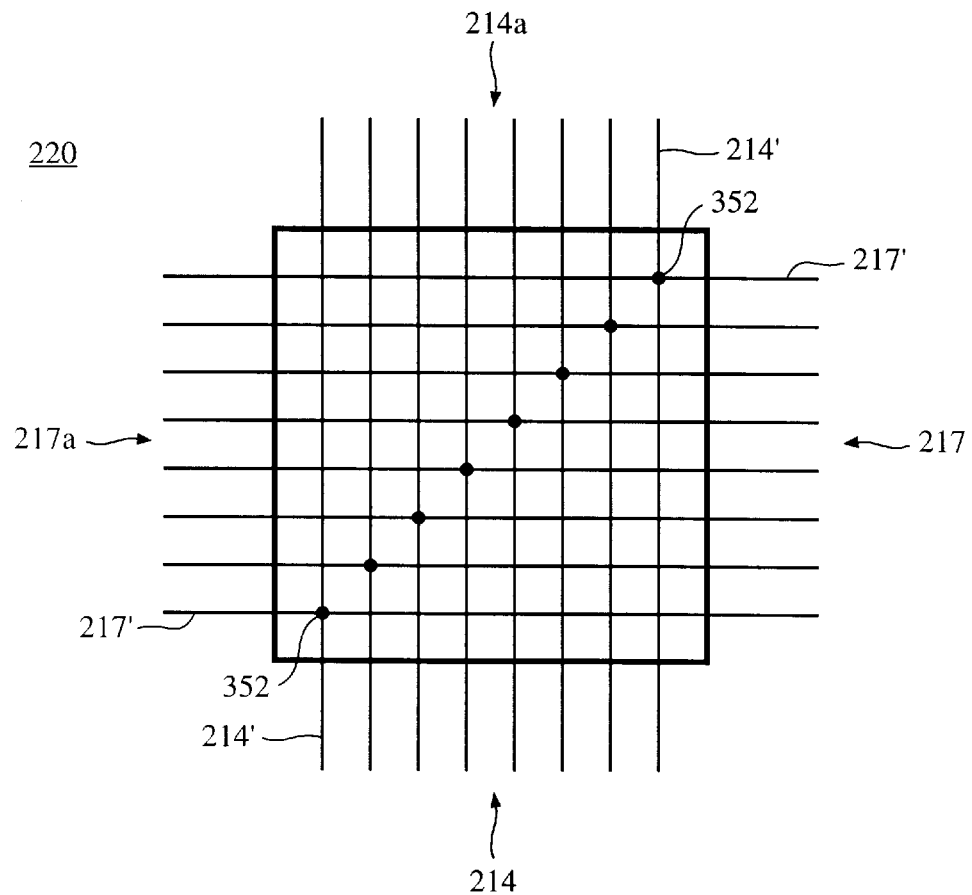
FIG. 5 illustrates a circuit schematic of a switch matrix circuit used in accordance with the present invention.

With reference to FIG. 5, a diagram of a programmable switch matrix 220 is shown. At the top, eight lines 214a pass through matrix 220 and at the left eight lines 217a pass through matrix 220. At each intersection of a line 214a and a line 217a, a six-transistor matrix 352 is placed. In this manner, switch matrix 220 allows a signal originating from vertical lines 214a (or lines 214) to be placed onto lines 217a or 217. Similarly, switch matrix 220 allows a signal originating from horizontal lines 217a (or lines 217) to be placed onto lines 214a or 214.

Figure 6:
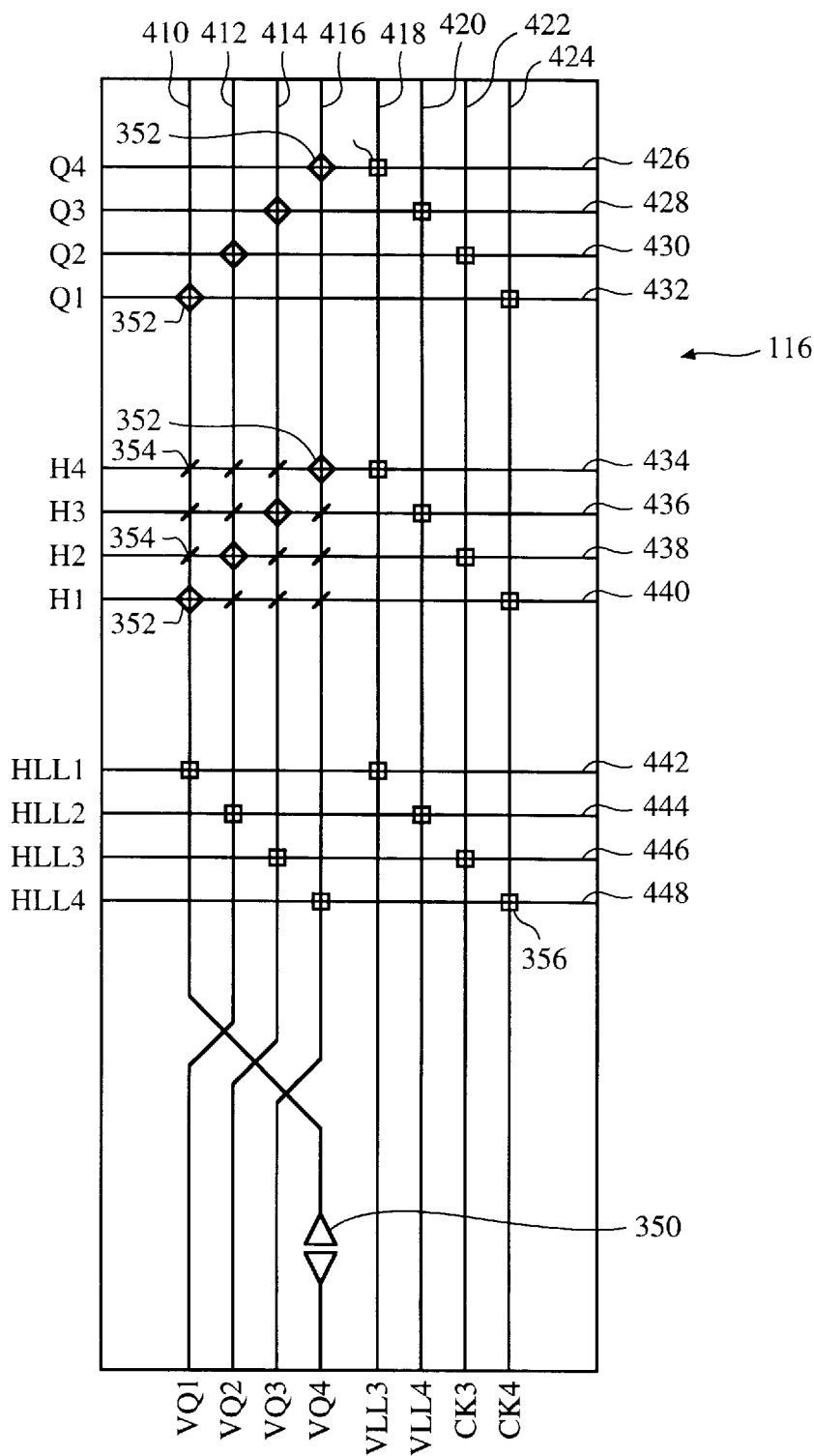
FIG. 6 is a detailed view of a vertical signal routing resource tile (VSI) in accordance with the present invention.

Referring now to FIG. 6, a VSI tile 116 of the present invention is shown in greater detail. VSI tile 116 comprises a plurality of vertical conductive segments 410, 412, 414, 416, 418, 420, 422, and 424. In this embodiment, segments 410, 412, 414, and 416 are quad line segments, and segments 418, 420, 422, and 424 are long line segments. In one preferred embodiment, quad line segments 410, 412, 414, and 416 can be interconnected with adjacent vertical tiles 116 (and corners 118) to form local, octal and quad signal lines, and segments 418, 420, 422, and 424 can be interconnected with adjacent tiles to form long lines which are useful for routing clock or other control lines.

Also passing through vertical tile 116 of the present invention are a plurality of horizontal conductive segments 426, 428, 430, 432, 434, 436, 438, 440, 442, 444, 446, and 448 which are part of the existing interconnect structure of the CLB array and are not considered "additional" routing resources added by the tiles of the present invention. The layout positioning of segments 426, 428, 430, 432, 434, 436, 438, 440, 442, 444, 446, and 448 permit interface with input/output ports of the adjoining CLBs to the left or right of VSI tile 116 as will be described in more detail below.

As with HSI tile 114 of FIG. 3, VSI tile 116 of FIG. 6 includes active elements such as bi-directional buffer 350 and programmable interconnects comprising a plurality of six-transistor matrices 352, PIPs 354, and line buffers 356 which permit the selective coupling of segments 410–424 to CLB interconnect segments 426, 428, 430, 432, 434, 436, 438, 440, 442, 444, 446, and 448. With reference to the position of an exemplary vertical tile 116 in FIG. 2: lines (CLB ports) 426, 428, 430, and 432 correspond to lines 217b; lines (CLB ports) 434, 436, 438, and 440 correspond to lines 218a; and lines (CLB ports) 442, 444, 446, and 448 correspond to lines 219b.

Figure 7:
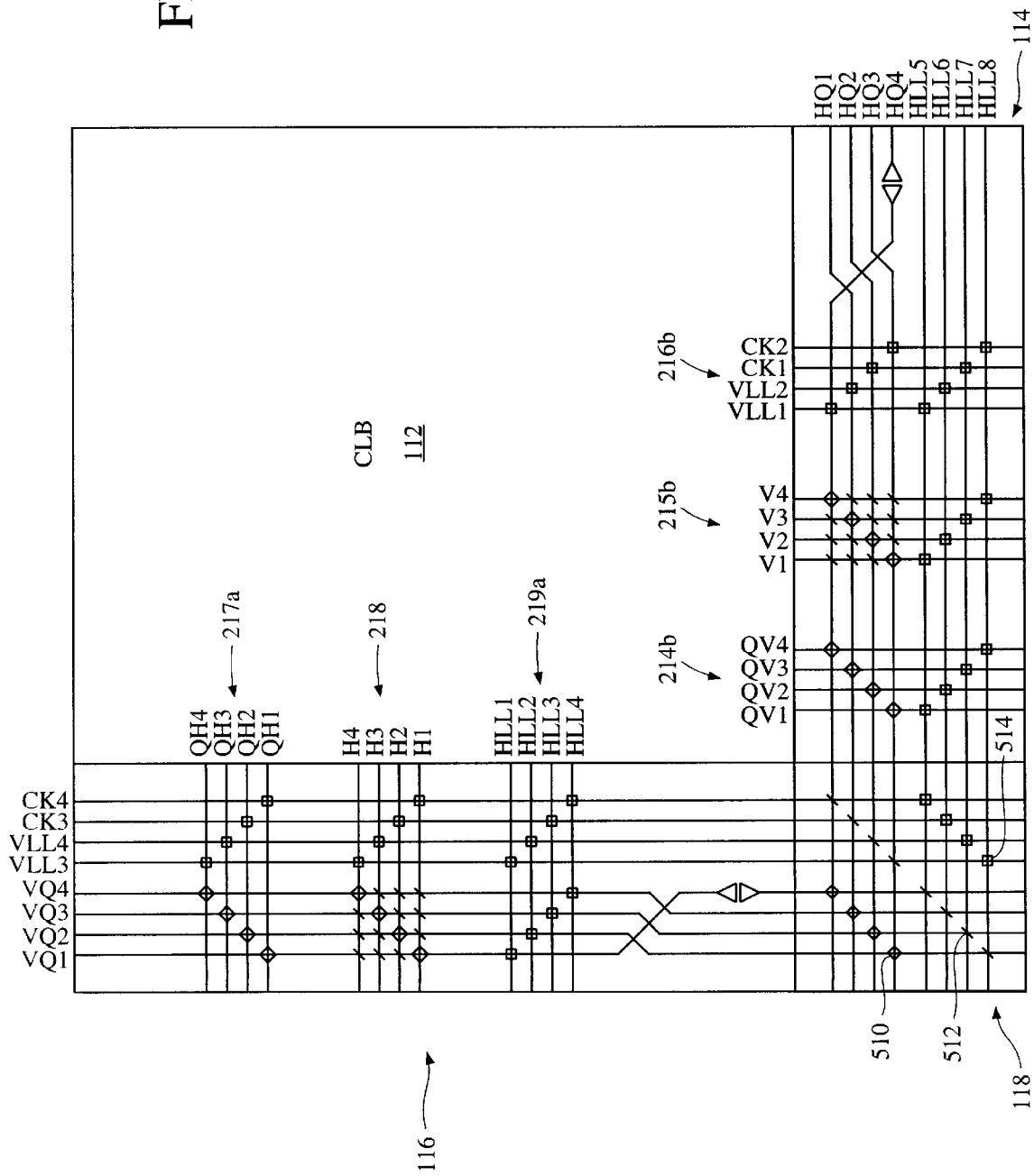
FIG. 7 illustrates a representative CLB interfaced with vertical (VSI), horizontal (HSI) and corner routing resource tiles of the present invention.

Referring now to FIG. 7, HSI tile 114 and VSI tile 116 are shown positioned along the lower horizontal boundary of CLB 112 and along the left vertical boundary of CLB 112, respectively. Selective interconnection capability between tiles 114 and 116 is provided by corner tile 118 which, in one preferred embodiment, includes a first plurality of disposed six-transistor matrices 510, a second plurality of disposed PIPs 512, and a third plurality of disposed line buffers 514. In one embodiment, the vertical conductors are in a layer insulated from the horizontal conductors with electrical connections there-between.

One skilled in the art will appreciate that additional (or fewer) six-transistor matrices, buffers, or PIPs could be added to (or removed from) tiles 114, 116 or 118 to alter the programmable capability of the present invention. However, since each six-transistor matrix, buffer or PIP will increase line loading and affect transmission rates, designers skilled in the art can opt for a minimum configuration of interconnections that permits flexible design options while minimizing degradation of circuit parameters. Accordingly, corner tile 118 can, in some embodiments, entirely omit interconnection capability and act as a jumper or feed-through between adjacent horizontal tiles 114 and adjacent vertical tiles 116.

Figure 8:
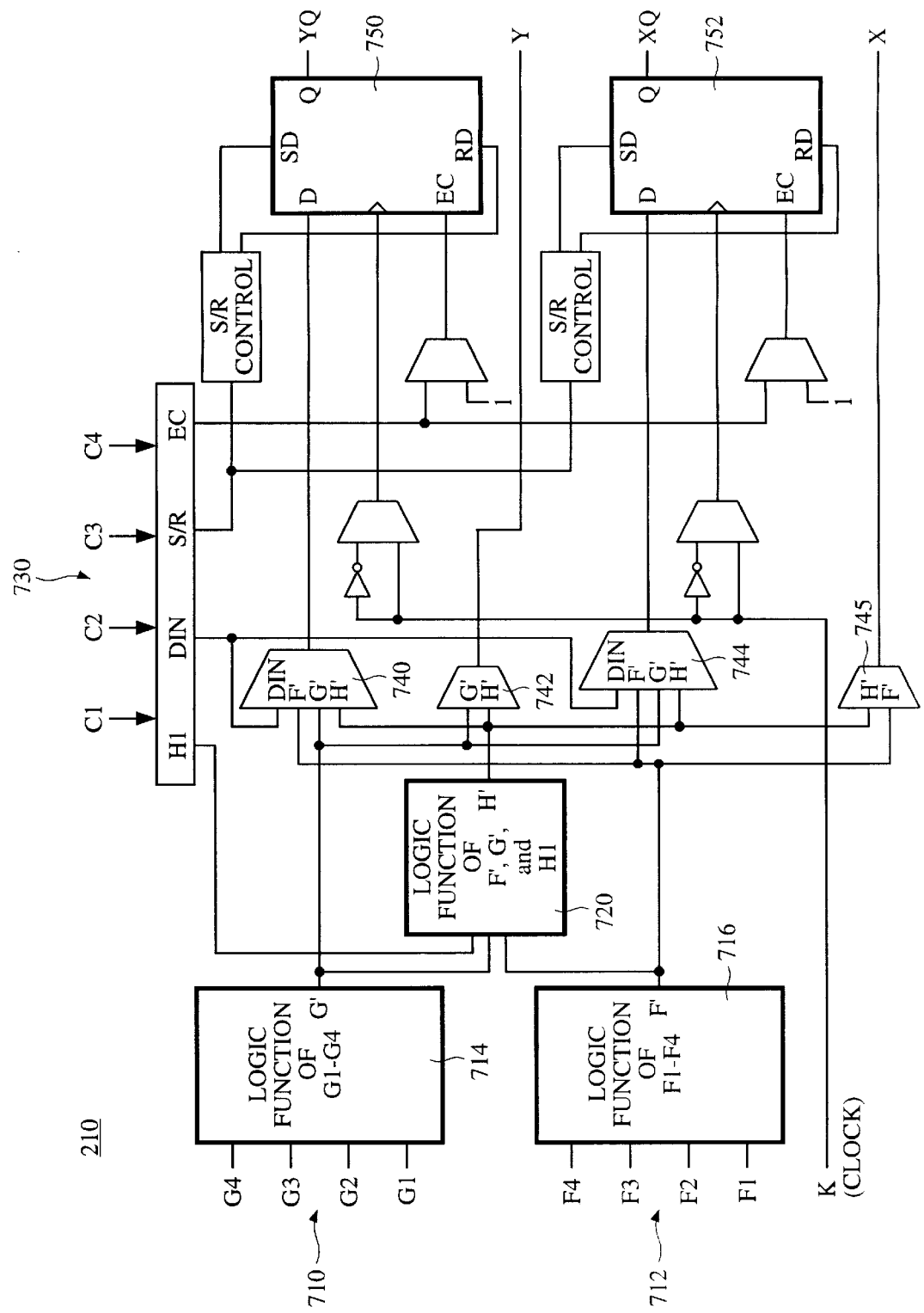
FIG. 8 is a block diagram of an exemplary logic element of a CLB.

FIG. 8 illustrates an exemplary logic element portion 210 of an exemplary CLB 112 within one embodiment of the present invention. The logic element 210 contains two programmable look-up tables (e.g., RAMS) 714 and 716 that are addressed by input signals 710 and 712, respectively. The data outputs of tables 714 and 716 are input to programmable look-up table 720. The data outputs of tables 714 and 716 and look-up table 720 are output to various inputs of multiplexer (mux) 740, mux 742, mux 744, and mux 745. Other inputs at 730 are also received by logic element 210. Outputs YQ and XQ are taken from latches 750 and 752 respectively and outputs Y and X are taken from mux 742 and 745, respectively. CLB 112 is also described on pages 2–9 to 2–10 of "The Programmable Logic Data Book" by Xilinx, Inc. of San Jose, Calif., (1994).

Generally, it is a particular advantage of the present invention that line buffering and CLB interconnections can be configured in HSI tiles 114 and/or VSI tiles 116 rather than solely relying on connections set up by switch matrices 220 (FIG. 2). It is a further advantage of the present invention that the layout of the integrated circuit device can be adapted to provide sufficient routing and interconnection resources (by addition of tiles) in addition to the routing and interconnection resources provided by each CLB. The additional routing resources of the present invention are added where needed.

It is appreciated that the basic structure of HSI tile 114 and VSI tile 116 contain relatively few line interconnects. If more interconnects are required in any given region, a line of vertical 114 or horizontal 116 tiles can be made wider by application of more adjacent tiles.

As logic designers attempt to implement ever more complex logic functions, the size of the CLB array will increase to provide adequate logic resources. However, it is common for large-array integrated circuit devices to utilize only, by way of example, 50% to 60% of the available CLBs. However, when the tiles 114, 116 and 118 of the present invention are available, utilization rates increase significantly. For example, for a prior art 68×68 array which provides about 4,600 CLBs, it is common to utilize roughly 2,500 or the available CLBs (54% utilization). However, for a 68×68 array having the routing resource tiles of the present invention, it is possible to utilize 3,700 (e.g., 80% utilization) or more of the available CLBs without significantly increasing the size of the integrated circuit device. By reducing the size, the cost is also reduced. For smaller arrays, such as a 34×34 array, it is possible to utilize 90% to 100% of the available CLBs without significantly increasing the size of the integrated circuit device.

Since the tiles of the present invention are modular, it is possible to replicate the tiles across the array of the integrated circuit in areas of the integrated circuit where routing congestion is anticipated. Thus, even though the area of the tiles is as large as a portion of the area of the CLB, the size of the resultant array (with tiles) is not proportionally increased. Further, as new arrays are developed in accordance with the present invention, existing macro cell libraries can be utilized with the necessary routing resources provided by the additional of the plurality of tiles to overcome the restricted routing capability often encountered in large arrays while minimizing the size of the integrated circuit device.

It is also possible to use the circuit files for the tiles for simulation of logic functions when migrating to different processes. Further, since the tiles are compact and modular, electrical performance characteristics such as signal delay and propagation times may be determined by placing the tiles on test chips. Accordingly, it is possible to modify existing place and route application software and design verification application software to include electrical characteristics of the tiles of the present invention.

In the above description of the embodiments of the present invention, reference is made to the accompanying drawings which form a part hereof, and in which is shown by way of illustration a specific embodiment in which the invention can be practiced. It is to be understood that other embodiments can be utilized and that changes may be made without departing from the scope of the present invention. For purposes of illustration the following description describes the present invention as used with field programmable gate arrays (FPGAs). However, it is contemplated that the present invention can be used in conjunction with other programmable array based semiconductor products that employ standard cell macro libraries such as application specific integrated circuits (ASICs) or complex programmable logic devices (CPLDs).

While certain exemplary preferred embodiments have been described and shown in the accompanying drawings, it is to be understood that such embodiments are merely illustrative of and not restrictive on the broad invention. Further, it is to be understood that this invention shall not be limited to the specific construction and arrangements shown and described since various modifications or changes may occur to those of ordinary skill in the art without departing from the spirit and scope of the invention as claimed.

I claim:

1. A semiconductor device having an array of configurable logic blocks each having programmable logic elements and programmable routing resources, said semiconductor device comprising:

a first plurality of coupled modular routing resource tiles having a plurality of conductive segments for coupling to a first set of configurable logic blocks, each of said first plurality of modular routing resource tiles positioned proximate to a first edge of a corresponding one of said configurable logic blocks of said first set, said first plurality of tiles having programmable circuitry for selectively coupling to the routing resources of said configurable logic blocks of said first set;

a second plurality of coupled modular routing resource tiles having a plurality of conductive segments for coupling to a second set of configurable logic blocks, each of said second plurality of modular routing resource tiles positioned proximate to a second edge of a corresponding one of said configurable logic blocks of said second set, said second plurality of tiles having programmable circuitry for selectively coupling to the routing resources of said configurable logic blocks of said second set; and interconnecting circuitry for interconnecting said first and second modular routing resource tiles.

2. The semiconductor device of claim 1 further comprising:

a first input/output block located on a first edge of said device; and a second input/output block located on a second edge of said device, wherein said first plurality of coupled modular routing resource tiles provide a modular communication pathway between said first input/output block and said second input/output block.

3. The semiconductor device of claim 1 further comprising:

a first input/output block located on a first edge of said device; and a second input/output block located on said first edge of said device, wherein said first plurality of coupled modular routing resource tiles provide a modular communication pathway between said first input/output block and said second input/output block.

4. The semiconductor device of claim 1 wherein said configurable logic blocks of said first and second set are generally rectangular in boundary, said first edge of each configurable logic block comprises a vertical edge of said boundary and said second edge of each configurable logic block comprises a horizontal edge of said boundary.

5. The semiconductor device of claim 4 wherein said first plurality of modular routing resource tiles comprise:

vertical modular tiles each having a plurality of vertical long line segments and a plurality of vertical quad line segments; and programmable circuitry for coupling each of said plurality of vertical long line and quad line segments to individual segments of a plurality of horizontal line segments, said plurality of horizontal line segments being part of the routing resources within a configurable logic block.

6. The semiconductor device of claim 4 wherein said second plurality of modular routing resource tiles comprise: horizontal modular tiles each having a plurality of horizontal long line segments and a plurality of horizontal quad line segments; and programmable circuitry for coupling each of said plurality of horizontal long line and quad line segments to individual segments of a plurality of vertical line segments, said plurality of vertical line segments being part of the routing resources within a configurable logic block.

7. The semiconductor device of claim 4 wherein said interconnecting circuitry comprises a modular corner tile having:

first circuitry for connecting vertical long line segments of a first modular vertical tile to corresponding vertical long line segments of an adjacent second modular vertical tile;

second circuitry for connecting vertical quad line segments of said first modular vertical tile to corresponding vertical quad line segments of said adjacent second modular vertical tile;

third circuitry for connecting horizontal long line segments of a first modular horizontal tile to corresponding horizontal long line segments of an adjacent second modular horizontal tile; and fourth circuitry for connecting horizontal quad line segments of said first modular horizontal tile to corresponding horizontal quad line segments of said adjacent second modular horizontal tile.

8. The semiconductor device of claim 7 wherein said interconnecting circuitry further comprises a plurality of programmable interconnects for coupling individual vertical long line and quad line segments of a modular vertical tile to one or ones of said horizontal long line and quad line segments of a modular horizontal tile.

9. A field programmable gate array integrated circuit device comprising:

a plurality of configurable logic blocks each comprising: programmable logic elements for implementing logic functions;

a programmable interconnect structure of horizontal and vertical signal lines; and at least one switch matrix for interconnecting individual signal lines of said horizontal and vertical signal lines; and a plurality of intercoupled modular routing resource tiles each comprising a plurality of conductive segments and programmable circuitry coupled thereto for selectively coupling said plurality of conductive segments to individual signal lines of said horizontal and vertical signal lines, said plurality of modular routing resource tiles coupled together and disposed in areas of said field programmable gate array expected to have routing resource congestion attributed to dense concentrations of said configurable logic blocks.

10. The field programmable gate array integrated circuit device of claim 9 wherein said programmable circuitry comprise: programmable buffers; programmable six-transistors matrices; and programmable interconnect point circuits.

11. The field programmable gate array integrated circuit device of claim 9 wherein said plurality of modular routing resource tiles comprise:

a plurality of intercoupled modular vertical tiles providing additional routing resources in a vertical direction across said array;

a plurality of intercoupled modular horizontal tiles providing additional routing resources in a horizontal direction across said array; and a plurality of modular corner tiles, said modular corner tiles for programmably coupling routing resources of said modular vertical tiles with said routing resources of said modular horizontal tiles.

12. The field programmable gate array integrated circuit device of claim 11 wherein said modular corner tiles further comprise:

first circuitry for interconnecting one of said plurality of vertical tiles to another proximate vertical tile to form a contiguous conductor having a length longer than the length of two configurable logic blocks; and second circuitry for interconnecting one of said plurality of horizontal tiles to another proximate horizontal tile to form a contiguous conductor having a length longer than the length of two configurable logic blocks.

13. A field programmable gate array integrated circuit device comprising:

a plurality of configurable logic blocks each comprising: programmable logic elements for implementing logic functions; a programmable interconnect structure of horizontal and vertical signal lines; and at least one switch matrix for interconnecting individual signal lines of said horizontal and vertical signal lines; and a plurality of horizontal modular routing resource tiles each comprising a plurality of conductive segments and programmable circuitry coupled thereto for selectively coupling said plurality of conductive segments to individual signal lines of said vertical signal lines of said configurable logic blocks;

a plurality of vertical modular routing resource tiles each comprising a plurality of conductive segments and programmable circuitry coupled thereto for selectively coupling said plurality of conductive segments to individual signal lines of said horizontal signal lines of said configurable logic blocks; and a plurality of corner modular routing resource tiles for coupling individual horizontal modular routing resource tiles to one another to form horizontal lines, for coupling individual vertical modular routing resource tiles to one another to form vertical lines, and for coupling individual vertical modular routing resource tiles to individual horizontal modular routing resource tiles.

14. The field programmable gate array integrated circuit device of claim 13 wherein said programmable circuitry of said horizontal and vertical modular routing resource tiles comprise programmable buffers.

15. The field programmable gate array integrated circuit device of claim 13 wherein said programmable circuitry of said horizontal and vertical modular routing resource tiles comprise programmable six-transistors matrices.

16. The field programmable gate array integrated circuit device of claim 13 wherein said programmable circuitry of said horizontal and vertical modular routing resource tiles comprise programmable interconnect point circuits.

17. The field programmable gate array integrated circuit device of claim 16 wherein said modular corner routing resource tiles comprise:

first circuitry for interconnecting one of said plurality of vertical modular routing resource tiles to another proximate vertical modular routing resource tile to form a contiguous conductor having a length longer than the length of two configurable logic blocks; and second circuitry for interconnecting one of said plurality of horizontal modular routing resource tiles to another proximate horizontal modular routing resource tile to form a contiguous conductor having a length longer than the length of two configurable logic blocks.

18. The field programmable gate array integrated circuit device of claim 13 wherein said plurality of conductive segments of said horizontal and vertical modular routing resource tiles comprise:

substantially parallel long line conductive segments; and quad line conductive segments having a programmable bi-directional buffer coupled to one of said quad line conductive segments for buffering each quad line conductive segments once every four coupled tiles.

19. The field programmable gate array integrated circuit device of claim 18 wherein said programmable circuitry of said horizontal and vertical modular routing resource tiles comprise programmable six-transistors matrices coupled to said quad line conductive segments and programmable interconnect point circuits coupled to said quad line conductive segments.

20. The field programmable gate array integrated circuit device of claim 18 wherein said programmable circuitry of said horizontal and vertical modular routing resource tiles comprise programmable buffers coupled to long line conductive segments.

21. A method for increasing the routing resources of a field programmable gate array integrated circuit device, said method comprising the steps of:

a) placing a plurality of configurable logic blocks in a plurality of rows and columns of an array, each of said configurable logic blocks having programmable logic elements and programmable routing resources;

b) placing a plurality of modular vertical routing resource tiles between selected columns of said plurality of columns of configurable logic blocks;

c) placing a plurality of modular horizontal routing resource tiles between selected rows of said plurality of rows of configurable logic blocks; and d) placing a plurality of modular corner tiles at intersections of said plurality of vertical routing resource tiles and said plurality of horizontal routing resource tiles, such that said plurality of modular horizontal, vertical and corner tiles are disposed within areas of said array to relieve routing resource congestion.

22. A method as described in claim 21 wherein said steps b), c) and d) dispose vertical and horizontal routing resource tiles within the central portion and the periphery of said field programmable gate array.

23. A semiconductor device having an array of configurable logic blocks each having programmable logic elements and programmable routing resources, said semiconductor device comprising:

a first plurality of coupled modular routing resource tiles having a plurality of conductive segments for coupling to a first set of configurable logic blocks, each of said first plurality of modular routing resource tiles positioned proximate to a first edge of a corresponding one of said configurable logic blocks of said first set, said first plurality of tiles having programmable circuitry for selectively coupling to the routing resources of said configurable logic blocks of said first set.

* * * * *